United States Patent
Koeda et al.

(10) Patent No.: US 7,354,803 B2
(45) Date of Patent: Apr. 8, 2008

(54) METHOD FOR MANUFACTURING SUBSTRATE CONJUGATE, SUBSTRATE CONJUGATE, METHOD FOR MANUFACTURING ELECTRO-OPTICAL APPARATUS, AND ELECTRO OPTICAL APPARATUS

(75) Inventors: Hiroshi Koeda, Suwa (JP); Tomohiro Makigaki, Azusagawa-mura (JP)

(73) Assignee: Seiko Epson Corporation (JP)

( * ) Notice: Subject to any disclaimer, the term of this patent is extended or adjusted under 35 U.S.C. 154(b) by 99 days.

(21) Appl. No.: 10/959,036

(22) Filed: Oct. 5, 2004

(65) Prior Publication Data

US 2005/0095409 A1    May 5, 2005

(30) Foreign Application Priority Data

Oct. 6, 2003 (JP) .............................. 2003-347129

(51) Int. Cl.
H01L 21/44 (2006.01)
H01L 21/48 (2006.01)
H01L 21/50 (2006.01)
H01L 21/00 (2006.01)

(52) U.S. Cl. .................... 438/119; 438/26; 438/29; 438/34

(58) Field of Classification Search ................ 438/119, 438/118, 34, 26, 29
See application file for complete search history.

(56) References Cited

U.S. PATENT DOCUMENTS

| 6,175,345 | B1 | 1/2001 | Kuribayashi et al. |
| 6,373,455 | B1 | 4/2002 | Kuribayashi et al. |
| 6,909,110 | B2 * | 6/2005 | Park et al. ..................... 257/40 |
| 6,989,600 | B2 | 1/2006 | Kubo et al. |
| 7,013,562 | B2 * | 3/2006 | Gurumurthy .................. 29/852 |
| 7,071,031 | B2 * | 7/2006 | Pogge et al. ................. 438/109 |
| 2003/0032218 | A1 * | 2/2003 | Kado et al. .................. 438/111 |
| 2003/0136966 | A1 | 7/2003 | Inoue et al. |
| 2004/0169273 | A1 * | 9/2004 | Chiang et al. ............... 257/734 |

FOREIGN PATENT DOCUMENTS

| JP | 08-078622 | | 3/1996 |
| JP | 09181491 A | * | 7/1997 |
| JP | 11-3048 | | 6/1999 |
| JP | 2001-282123 | | 10/2001 |
| JP | 2002-55359 | | 2/2002 |
| JP | 2003-082633 | | 3/2002 |

(Continued)

OTHER PUBLICATIONS

Communication from Japanese Patent Office regarding corresponding application.

(Continued)

*Primary Examiner*—Shouxiang Hu
(74) *Attorney, Agent, or Firm*—Harness, Dickey & Pierce, P.L.C.

(57) ABSTRACT

A method for manufacturing a substrate conjugate is provided including a step of joining a first substrate including a first functional device to a second substrate including a second functional device and a step of providing a protective layer on at least one of: a face of the first substrate on which the first functional device is placed; and a face of the second substrate on which the second functional device is placed.

15 Claims, 7 Drawing Sheets

FOREIGN PATENT DOCUMENTS

| | | |
|---|---|---|
| JP | 2003-208108 | 7/2003 |
| KR | 10-2004-0015506 | 2/2004 |
| WO | WO 01/82367 | 11/2001 |
| WO | 03/53109 A1 | 6/2003 |

OTHER PUBLICATIONS

Communication from Korean Patent Office regarding counterpart application.

Communication from Japanese Patent Office regarding counterpart application.

Communicationfrom Japanese Patent Office regarding corresponding application, 2006.

Communication from Korean Patent Office regarding counterpart application, 2006.

Communication from Japanese Patent Office regarding counterpart application, 2006.

* cited by examiner

METHOD FOR MANUFACTURING SUBSTRATE CONJUGATE, SUBSTRATE CONJUGATE, METHOD FOR MANUFACTURING ELECTRO-OPTICAL APPARATUS, AND ELECTRO OPTICAL APPARATUS

RELATED APPLICATIONS

This application claims priority to Japanese Patent Application No. 2003-347129 filed Oct. 6, 2003 which is hereby expressly incorporated by reference herein in its entirety.

BACKGROUND

1. Technical Field

The present invention relates to a method for manufacturing a substrate conjugate, such a substrate conjugate, a method for manufacturing an electro-optical apparatus, and such an electro-optical apparatus.

2. Background Art

In recent years, the following technique has been proposed for manufacturing substrate conjugates prepared by joining two species of substrates that are different from each other. For example, an electro-optical apparatus is manufactured by joining an electro-optical substrate including light-emitting devices such as organic electroluminescent devices (hereinafter referred to as organic EL devices) to a driving circuit substrate including driving devices for driving the light-emitting devices (see Japanese Unexamined Patent Application Publication No. 2002-082633).

In the technique, since the electro-optical substrate and the driving circuit substrate are prepared in different manufacturing steps and the electro-optical apparatus is then manufactured by joining the substrates together, only a small number of steps are necessary to process the driving circuit substrate on which the driving devices, for example, thin-film transistors (hereinafter referred to as TFTs), have been formed or to which the driving devices have been transferred. Hence, this technique is useful in greatly reducing the risk of damage to the driving devices during the manufacturing steps. Since the electro-optical substrate and the driving circuit substrate are prepared in different manufacturing steps as described above, the yield is high. Since the electro-optical substrate and the driving circuit substrate can be prepared in different factories or by companies and then joined to each other in some cases, this technique is advantageous in reducing manufacturing costs. Furthermore, large-screen electro-optical apparatuses can be manufactured with a relatively small capital investment.

In the above technique, the light-emitting devices are electrically connected to the driving devices with an electrically conductive material such as silver paste and a sealing resin is injected between the electro-optical substrate and the driving circuit substrate from the outside. The technique has a problem in that the gap between the substrates cannot be kept substantially constant because the silver paste deforms if one of the substrates is warped. Furthermore, it is difficult to inject the sealing resin between the substrates from the outside when the resin has high gas barrier properties. The technique further has a problem in that the light-emitting devices and the driving devices can be displaced or dislodged due to the residual stress of a polymer contained in the injected resin and/or due to a difference in shrinkage between portions of the resin during a curing step.

The present invention has been made to solve the above problems. It is an object of the present invention to provide a method for manufacturing a substrate conjugate, such a substrate conjugate, a method for manufacturing an electro-optical apparatus, and such an electro-optical apparatus. In the substrate conjugate-manufacturing method, the gap between substrates is kept constant by preventing the substrates from being warped and various devices are prevented from being broken due to residual stress by uniformly injecting a sealing resin between the substrates.

SUMMARY

In order to achieve the above object, the present invention provides the methods and apparatuses below.

A method for manufacturing a substrate conjugate according to the present invention includes a step of joining a first substrate including a first functional device to a second substrate including a second functional device and also includes a step of providing a protective layer on at least one of: a face of the first substrate on which the first functional device is placed; and a face of the second substrate on which the second functional device is placed.

The protective layer prevents the first and second functional devices from being dislodged and/or broken due to the pressure applied to the first and second substrates when they are joined to each other, due to the residual stress of a sealing resin, and due to a difference in shrinkage. Such protective layers may be placed on each of the first substrate face having the first functional device thereon and the second substrate face having the second functional device thereon.

According to the above method, since the protective layer is used, a stronger pressure can be applied to the first and second substrates when the substrates are joined to each other, as compared with the technique described in the Background Art, for electrically connecting the light-emitting devices to the driving devices with the electrically conductive material to inject the sealing resin between the electro-optical substrate and the driving circuit substrate. Therefore, in the present invention, the first and second substrates can be prevented from being warped, electrically conductive members can be prevented from being deformed, and the gap between the first and second substrates can be kept constant.

Since the protective layer prevents principal portions of the first and second functional devices from contacting the sealing resin, the first and second functional devices can be prevented from being dislodged and/or broken.

The method further includes a step of planarizing a surface of the protective layer.

Since the protective layer has a planarized surface, the gap between the first and second substrates can be kept constant when they are joined to each other.

Therefore, the advantages described above can be secured.

The method further includes a step of forming an opening in the protective layer such that the opening is located at a position corresponding to a terminal section electrically connected to the first or second functional device and a step of forming an electrical connection on the terminal section, wherein the electrical connection extends out of the opening to electrically connect the first functional device to the second functional device.

According to the above method, the opening can be formed at a position corresponding to the terminal section in such a manner that only principal portions of the first and second functional devices are covered with the protective layer. Furthermore, the electrical connection for electrically connecting the first functional device to the second functional device can be formed only on the terminal section.

Therefore, the first functional device can be electrically connected to the second functional device without sacrificing the advantage obtained by forming the protective layer.

In the method described above, the opening is formed in the protective layer in such a manner that light is applied to the protective layer through a mask having a pattern corresponding to the opening.

According to the method, since a predetermined pattern is formed in the mask in advance and UV light is then applied to the protective layer through the resulting mask, a region irradiated with the UV light and another region not irradiated with the UV light can be selectively formed depending on the pattern.

Therefore, a photoreactive resin such as a photocurable resin or a resin of which a portion irradiated with light can be removed, can be used to form the protective layer.

In the method, the opening is formed in the protective layer in such a manner that a template having a pattern corresponding to the opening is pressed against the protective layer.

The template is herein defined as a plate having a predetermined pattern to be transferred to the protective layer. In particular, the template includes a protrusion for forming the opening.

According to the method, the protrusion corresponding to the opening is allowed to perforate the protective layer by pressing the template against the protective layer and the shape of the protrusion can be transferred to the protective layer by removing the template from the protective layer, whereby the opening is formed in the protective layer.

Alternatively, the template may have a recessed section with a flat face for planarizing the surface of the protective layer. If the surface of the protective layer is not flat, the opening can be formed in the protective layer with the protrusion and the surface of the protective layer can be planarized with the recessed section by pressing the template having the protrusion and the recessed section against the protective layer. Therefore, the formation of the opening can be achieved together with the planarization of the protective layer. Hence, a step of planarizing the surface of the protective layer can be omitted. Thus, the number of manufacturing steps can be reduced, whereby manufacturing is reduced.

In the method, the electrical connection is formed in the opening by a plating process.

The plating process has advantages in that bumps can be formed at micron-sized areas, tact time can be reduced, and the bumps are uniform in thickness. An electroless plating process, which is a kind of plating process, is particularly preferable because no base electrode and no photolithographic process are necessary. Hence, manufacturing costs and tact time can be reduced.

According to the method, a metal coating can be grown on the terminal section, whereby the electrical connection can be formed.

In the method, the electrical connection is formed by providing a piece of silver paste in the opening.

According to the method, since the piece of silver paste is placed in the opening, the electrical connection can be formed without causing the silver paste to be deformed due to the pressure applied to the first and second substrates to join them together.

In the method, the electrical connection is formed by providing an electrical conductive particle in the opening.

The electrically conductive particle preferably includes a resin sphere containing polystyrene and an electrically conductive coating formed by depositing an electrically conductive material such as gold on the resin sphere.

According to the method, the resin sphere is crushed by the pressure applied to the first and second substrates to join them together, whereby the first functional device is electrically connected to the second functional device with the metal coating on the resin sphere. Therefore, the electrical connection functions well.

In the method, the electrical connection is formed by providing a piece of solder in the opening.

According to the method, the first functional device is electrically connected to the second functional device with the piece of solder placed in the opening. Therefore, the electrical connection functions well.

The method further includes a step of providing a sealing layer on the protective layer to seal the first and second substrates.

The sealing layer also functions as an adhesive layer for joining the first and second substrates together.

According to the method, the above advantages can be secured and the first and second substrates can be securely joined to each other and sealed because the sealing layer is placed on the protective layer.

In the method, the sealing layer contains anisotropic conductive paste or includes an anisotropic conductive film.

According to the method, the above advantages can be secured and the electrical connection can be securely electrically connected to the first or second functional device.

A substrate conjugate of the present invention includes a first substrate including a first functional device, a second substrate including a second functional device, and a protective layer. The first substrate is joined to the second substrate with the protective layer placed therebetween.

According to the above configuration, since the protective layer is used, a stronger pressure can be applied to the first and second substrates when the substrates are joined to each other, as compared with the technique described in the Background Art, for electrically connecting the light-emitting devices to the driving devices with the electrically conductive material to inject the sealing resin between the electro-optical substrate and the driving circuit substrate. Therefore, in the present invention, the first and second substrates can be prevented from being warped, electrically conductive members can be prevented from being deformed, and the gap between the first and second substrates can be kept constant.

Since the protective layer prevents principal portions of the first and second functional devices from contacting the sealing resin, the first and second functional devices can be prevented from being dislodged and/or broken.

A method for manufacturing an electro-optical apparatus according to the present invention includes a step of joining an electro-optical substrate including a plurality of light-emitting devices to a driving circuit substrate including a plurality of driving devices each located at positions corresponding to the light-emitting devices and also includes a step of providing a protective layer on at least one of: a face of the electro-optical substrate on which the light-emitting devices are arranged; and a face of the driving circuit substrate on which the driving devices are arranged.

According to the above method, since the protective layer is used, a stronger pressure can be applied to the first and second substrates when the substrates are joined to each other, as compared with the technique described in the Background Art, for electrically connecting the light-emitting devices to the driving devices with the electrically conductive material to inject the sealing resin between the electro-optical substrate and the driving circuit substrate. Therefore, in the present invention, the first and second substrates can be prevented from being warped, electrically conductive members can be prevented from being deformed, and the gap between the first and second substrates can be kept constant.

Since the protective layer prevents principal portions of the first and second functional devices from contacting the sealing resin, the first and second functional devices can be prevented from being dislodged and/or broken.

In particular, when the electro-optical apparatus includes an organic EL device (light-emitting device), which is deteriorated by contact with moisture and/or oxygen, to function as an electro-optical apparatus, the protective layer protects the organic EL device from moisture and oxygen. Therefore, the organic EL device can be prevented from being deteriorated and the electro-optical apparatus has a long life.

An electro-optical apparatus of the present invention includes an electro-optical substrate including a plurality of light-emitting devices, a driving circuit substrate including a plurality of driving devices, and a protective layer. The first substrate is joined to the second substrate with the protective layer placed therebetween.

According to the above configuration, since the protective layer is used, a stronger pressure can be applied to the first and second substrates when the substrates are joined to each other, as compared with the technique described in the Background Art, for electrically connecting the light-emitting devices to the driving devices with the electrically conductive material to inject the sealing resin between the electro-optical substrate and the driving circuit substrate. Therefore, in the present invention, the first and second substrates can be prevented from being warped, electrically conductive members can be prevented from being deformed, and the gap between the first and second substrates can be kept constant.

Since the protective layer prevents principal portions of the first and second functional devices from contacting the sealing resin, the first and second functional devices can be prevented from being dislodged and/or broken.

In particular, when the electro-optical apparatus includes an organic EL device (light-emitting device), which is deteriorated by contact with moisture and/or oxygen, to function as an electro-optical apparatus, the protective layer protects the organic EL device from moisture and oxygen. Therefore, the organic EL device can be prevented from being deteriorated and the electro-optical apparatus has long life.

DETAILED DESCRIPTION

A method for manufacturing a substrate conjugate, such a substrate conjugate, a method for manufacturing an electro-optical apparatus, and such an electro-optical apparatus according to the present invention will now be described with reference to FIGS. 1 to 12.

Figure 1:
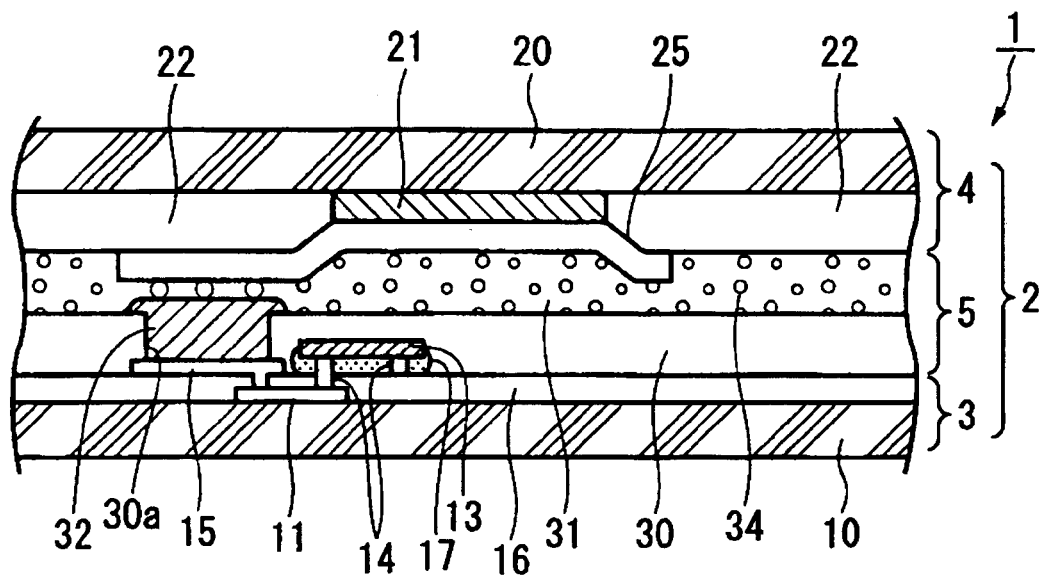
FIG. 1 is a sectional view showing a configuration of an organic EL apparatus according to a first embodiment of the present invention.

FIG. 1 is a sectional view showing a configuration of an organic EL apparatus according to a first embodiment of the present invention. FIGS. 2 to 11 are schematic views illustrating steps of manufacturing the organic EL apparatus. FIG. 12 is a sectional view showing a configuration of an organic EL apparatus according to a second embodiment of the present invention.

In the drawings herein referred to, in order to show members on a recognizable scale, different scales are used depending on the size of the members.

Organic EL Apparatus of First Embodiment

With reference to FIG. 1, the organic EL apparatus (electro-optical apparatus) 1 includes at least one substrate conjugate 2. The substrate conjugate 2 includes a wiring substrate (a first substrate or a driving circuit substrate) 3 and an organic EL substrate (a second substrate or an electro-optical substrate) 4, which are joined to each other in a joining and transferring step described below. The substrate conjugate 2 further includes a functional layer 5 placed between the wiring substrate 3 and the organic EL substrate 4.

The wiring substrate 3 includes a multilayer substrate 10; a wiring network 11 placed on the multilayer substrate 10 and having a predetermined pattern; TFTs (driving devices) 13 for driving organic EL devices (light-emitting devices) 21; TFT connections 14 for electrically connecting the TFTs 13 to the wiring network 11; organic EL connections (terminal sections) 15 for electrically connecting the organic EL devices 21 to the wiring network 11; and an interlayer insulating layer 16.

The TFT connections 14 are arranged depending on the pattern of TFT terminals and each include corresponding first bumps formed by an electroless plating process and corresponding pieces of first conductive paste 17 formed on the first bumps by a coating process. The first conductive paste 17 contains anisotropic conductive particles (ACPs).

The organic EL substrate 4 includes a transparent sheet 20 through which emitted light passes, the organic EL devices 21, an insulating layer 22, and cathodes 25.

The organic EL devices 21 each include corresponding anodes made of a transparent metal oxide, for example, ITO; hole injection/transfer layers; and organic EL layers. Light is emitted from the organic EL devices 21 by coupling together holes created in the anodes and electrons created in the cathodes 25 in the organic EL layers. The organic EL layers have a configuration formed by a known technique. Electron injection/transfer layers may be placed between the organic EL layers and the cathodes 25.

The functional layer 5 is placed between the wiring substrate 3 and the organic EL substrate 4. The functional layer 5 includes a protective layer 30 located on the side close to the wiring substrate 3; a sealing layer 31 for joining together the wiring substrate 3 and the organic EL substrate 4 and for sealing the substrates; second bumps (conductive sections) 32 each placed in corresponding through-holes (openings) 30a arranged in parts of the protective layer 30; and pieces of second conductive paste 34, each placed on the corresponding second bumps 32, for electrically connecting the organic EL connections 15 to the cathodes 25. The second conductive paste 34 contains anisotropic conductive particles (ACPs).

In this embodiment, the substrate conjugate 2 includes the organic EL substrate 4 that includes the organic EL devices 21 to function as an electro-optical substrate. The present invention is not limited to this embodiment. The substrate conjugate 2 may instead include, for example, an electro-optical substrate including solid light-emitting devices such as LEDs or FEDs or an electro-optical substrate including porous silicon devices having a luminescent function.

Method for Manufacturing Organic EL Apparatus

The organic EL apparatus 1 shown in FIG. 1 will now be described with reference to FIGS. 2 to 11.

Procedure for Manufacturing Base Substrate

A step of forming the TFTs 13 on a base substrate 40 is described below with reference to FIG. 2, this step being subsequent to a step of joining the base substrate 40 to the wiring substrate 3 to transfer the TFTs 13 to the wiring substrate 3.

Since the TFTs 13 are formed by a known process such as a high-temperature process, a description of the procedure for forming the TFTs 13 is omitted. The base substrate 40 and a release layer 41 are described below in detail.

The base substrate 40 is not a component of the organic EL apparatus 1 but a member used only in the TFT-forming step and the joining and transferring step. Examples of the base substrate 40 include a transparent heat-resistant substrate that is made of quartz glass and resistant to a temperature of about 1,000° C. The following heat-resistant glass materials are preferable: sodium glass, Corning 7059 glass, OA-2 glass manufactured by Nippon Electric Glass Co., Ltd., and the like.

The thickness of the base substrate 40 is not particularly limited and preferably ranges from 0.1 to 0.5 mm and more preferably 0.5 to 1.5 mm. When the base substrate 40 has an extremely small thickness, the base substrate 40 has low strength. In contrast, when the base substrate 40 has an extremely large thickness, emitted light is attenuated if the base substrate 40 has low transmittance. If the base substrate 40 has high transmittance, it may have a larger thickness above the upper limit.

The release layer 41 contains such a material that can cause delamination (referred to as "intralayer delamination" or "interfacial delamination") when it is irradiated with irradiation light, for example, laser light. That is, the following phenomenon occurs in that material: when the material is irradiated with light with a predetermined intensity, the interatomic force or intermolecular force of a component of the material is decreased or lost and ablation or the like therefore occurs, whereby the delamination is caused. The delamination can be caused in such a manner that a component contained in the release layer 41 is vaporized by light irradiation and the vapor is released or in such a manner that the release layer 41 absorbs light to create gas, which is released.

The release layer 41 may be made of amorphous silicon (a-Si), which may contain hydrogen (H). When hydrogen is contained therein, hydrogen gas is created by light irradiation and the pressure in the release layer 41 is therefore increased, whereby the delamination is promoted, which is preferable. The content of hydrogen is preferably about two atomic percents or more and more preferably two to 20 atomic percents. The hydrogen content is adjusted by controlling layer-forming conditions such as the gas composition, the gas pressure, the gas atmosphere, the gas flow rate, the gas temperature, the substrate temperature, and the input power when, for example, a CVD process is used. Examples of other materials for forming the release layer 41 include silicon dioxide; silicon oxide compounds; nitride ceramics such as silicon nitride, aluminum nitride, titanium nitride; organic polymers of which atomic bonds are broken by light irradiation; metals such as Al, Li, Ti, Mn, In, Sn, Y, La, Ce, Nd, Pr, Gd, and Sm; and alloy containing at least one selected from such metals.

The release layer 41 preferably has a thickness of about one nm to 20 µm, more preferably about ten nm to two µm, further more preferably about 20 nm to one µm. When the thickness of the release layer 41 is extremely small, the release layer 41 has a difference in thickness and uneven delamination is therefore caused. In contrast, when the thickness is extremely large, a large power (luminous energy) of light must be used to cause the delamination and/or it takes a long time to remove the residue of the release layer 41 remaining after the delamination.

The release layer 41 must be formed so as to have a uniform thickness and a process for forming the release layer 41 can be arbitrarily determined depending on requirements such as the composition and thickness of the release layer 41. Examples of the process for forming the release layer 41 include vapor-phase deposition processes such as a CVD process (including an MOCVD process, a low-pressure CVD process, a plasma CVD process, and an ECR-CVD process), vapor deposition, molecular beam epitaxy (MBE), a sputtering process, an ion doping process, and a PVD process; plating processes such as an electroplating process, a dip plating (dipping) process, and an electroless plating; coating processes such as the Langmuir-Blodgett process, a spin coating process, a spray coating process, and a roll coating process; printing processes; transfer processes; inkjet processes; and powder jet processes. Those processes may be used in combination.

When the release layer 41 contains amorphous silicon (a-Si), a CVD process is preferably used and the low-pressure CVD process and the plasma CVD process are particularly preferable. When the release layer 41 contains a ceramic material prepared by a sol-gel method or a polymer, a coating process is preferably used and the spin coating process is particularly preferable.

Procedure for Manufacturing Wiring Substrate

Figure 2:
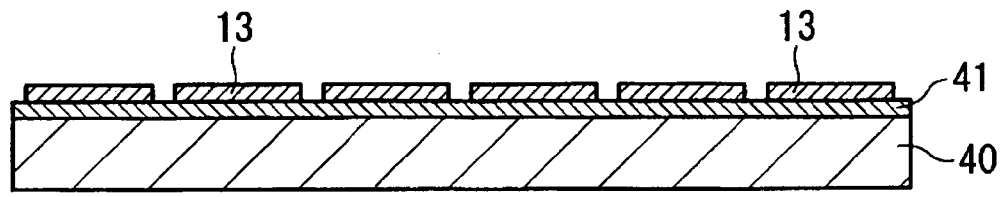
FIG. 2 is a schematic view illustrating one of steps of manufacturing the organic EL apparatus.
Figure 3:
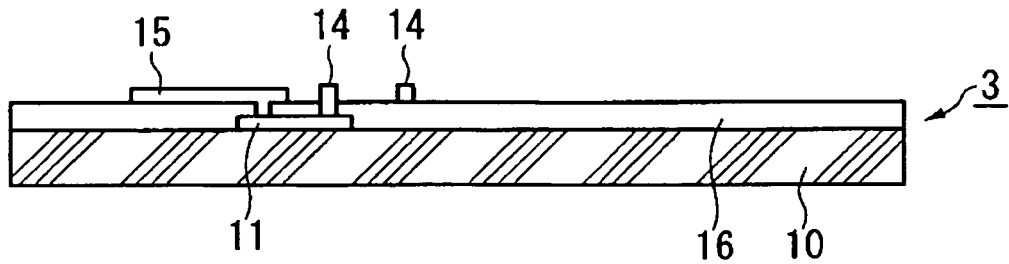
FIG. 3 is a schematic view illustrating one of the steps of manufacturing the organic EL apparatus.

A step of manufacturing the wiring substrate 3 shown in FIG. 3 is performed simultaneously with the step of manufacturing the base substrate 40 shown in FIG. 2.

With reference to FIG. 3, the wiring network 11, the interlayer insulating layer 16, the TFT connections 14, and the organic EL connections 15 are formed on the multilayer substrate 10 in that order. The wiring network 11 is formed by a known process such as a photolithographic process.

Alternatively, the wiring network 11 may be formed on the multilayer substrate 10 by a droplet-discharging process (an inkjet process) using a dispersion containing a solvent and metal particles dispersed therein. Preferable examples of a material for the wiring network 11 include low-resistance materials such as Al and an Al alloy, for example, an Al—Cu alloy.

A silicon dioxide ($SiO_2$) layer or another layer functioning as a base insulating layer may be formed on the multilayer substrate 10. With reference to FIG. 3, the single wiring network 11 is used; however, two or three wiring networks may be used. The material for forming the wiring network 11 is not limited to Al and the Al alloy and the wiring network 11 may have a sandwich structure including first layers containing Ti or a Ti compound and a second layer, placed therebetween, containing a low-resistance metal such as Al. According to such a structure, the wiring network 11 has high barrier properties and hillock resistance.

Next, the interlayer insulating layer 16 is formed on the wiring network 11. The interlayer insulating layer 16 preferably contains an acrylic resin and can be formed by a liquid phase process such as a spin coating process so as to have high flatness. Openings for forming the TFT connections 14 and the organic EL connections 15 are formed in the interlayer insulating layer 16 by light exposure or a photolithographic process-using a mask.

Next, the TFT connections 14 are formed by an electroless plating process as described below. The TFT connections 14 each include the corresponding first bumps as described above.

In order to enhance the wettability of the surfaces of buds on which metal coatings are formed and in order to remove dust, the wiring substrate 3 is immersed in an aqueous solution containing hydrofluoric acid and sulfuric acid. The resulting wiring substrate 3 is immersed in an alkaline aqueous solution containing sodium hydroxide, whereby oxide layers on the bud surfaces are removed. The resulting wiring substrate 3 is immersed in a zincate solution containing ZnO, whereby the bud surfaces are covered with a zincate. The resulting wiring substrate 3 is immersed in an aqueous nitric acid solution, whereby the zincate is removed. The resulting wiring substrate 3 is immersed in the zincate solution containing ZnO again, whereby fine zincate particles are deposited on the bud surfaces. The resulting wiring substrate 3 is then immersed in an electroless nickel plating bath, whereby nickel coatings are formed on the bud surfaces. The nickel coatings have a thickness of about 2 (two) to 10 (ten) μm. Since the plating bath contains a hypophosphorous acid reductant, phosphoric oxides are deposited on the bud surfaces together with the zincate particles. The resulting wiring substrate 3 is finally immersed in a gold plating bath, whereby the nickel coatings are each covered with corresponding gold coatings. The gold coatings have a thickness of about 0.05 to 0.3 μm. The gold plating bath does not contain any cyan compound.

According to the above procedure, the first bumps (TFT connections 14) containing nickel and gold are formed. Pieces of solder or lead-free solder, for example, tin-silver-copper solder may be provided on the first bumps containing nickel and gold by a screen printing process or a dipping process.

A water-washing step is performed between chemical treating steps using a water-washing tank having an overflow system or a QDR system. Nitrogen bubbles released from a bottom area of the tank. The bubbles are released from a Teflon® tube, placed at the tank bottom, having holes or released from a porous sintered body. In this step, the wiring substrate 3 can be efficiently rinsed in a short time.

Next, the organic EL connections 15 are formed by a known deposition process. Examples of the deposition process include various vapor phase processes, such as a CVD process, a sputtering process, a vapor deposition process, and an ion plating process, used to manufacture semiconductor devices.

The organic EL connections 15 may be formed by a liquid phase process. In this process, a dispersion containing a solvent and metal particles dispersed therein is used. Examples of the liquid phase process include a spin coating process, a slit coating process, a dip coating process, a spray coating process, a roll coating process, a curtain coating process, a printing process, and an inkjet process.

According to a series of the steps described above, the wiring substrate 3 is completed.

Step of Transferring TFTs

Figure 4:
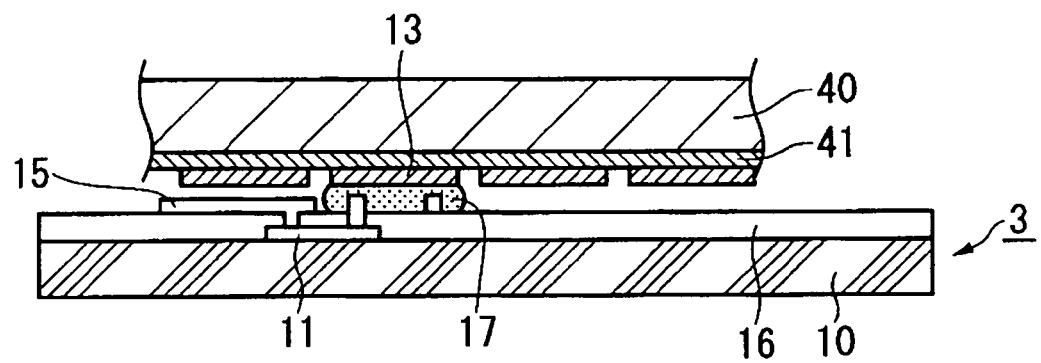
FIG. 4 is a schematic view illustrating one of the steps of manufacturing the organic EL apparatus.
Figure 5:
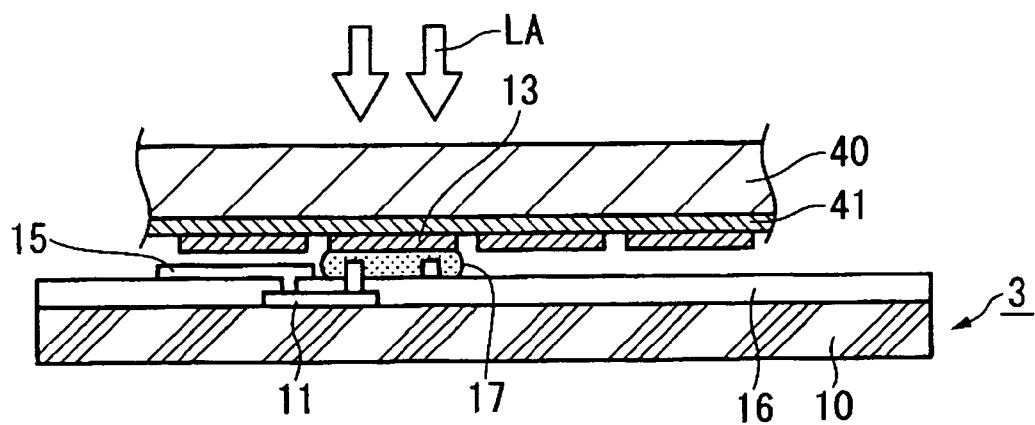
FIG. 5 is a schematic view illustrating one of the steps of manufacturing the organic EL apparatus.
Figure 6:
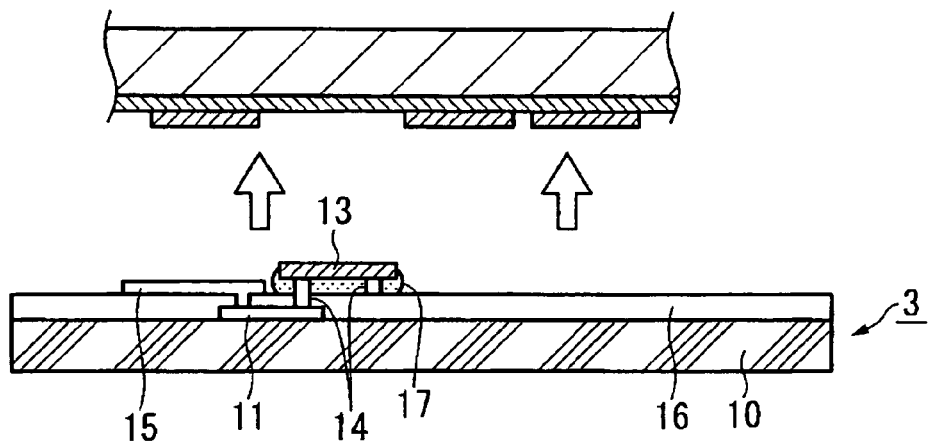
FIG. 6 is a schematic view illustrating one of the steps of manufacturing the organic EL apparatus.

With reference to FIGS. 4 to 6, a step of transferring the TFTs 13 to the wiring substrate 3 by joining the wiring substrate 3 to the base substrate 40 will now be described. In the transferring step, a known process may be used; however, in this embodiment, a process referred to as SUFTLA® (Surface Free Technology by Laser Ablation) is used in particular.

With reference to FIG. 4, the base substrate 40 is turned over, pieces of the first conductive paste 17 containing the anisotropic conductive particles (ACPs) are placed between the TFTs 13 and the TFT connections 14, and the base substrate 40 is then joined to the wiring substrate 3.

Next, with reference to FIG. 5, regions covered with the pieces of the first conductive paste 17 are locally irradiated with laser light LA passing through the rear face of the base substrate 40 on which no TFTs are arranged, whereby the interatomic or intermolecular force of the release layer 41 is weakened. Therefore, hydrogen contained in the release layer 41 is formed into molecules, which are released therefrom, whereby the bonding force between the TFTs 13 and the protective layer 30 is completely lost. Thus, the TFTs 13 placed on the regions irradiated with the laser light LA can be readily removed from the base substrate 40.

Next, with reference to FIG. 6, the base substrate 40 is removed from the wiring substrate 3, whereby the TFTs 13 are separated from the base substrate 40 and transferred to the wiring substrate 3. Terminals of the TFTs 13 are electrically connected to the wiring network 11 with the TFT connections 14 and the first conductive paste 17.

Step of Forming Functional Layer

With reference to FIGS. 7 to 10, a step of forming the functional layer 5 will now be described.

The functional layer 5 is formed according to the following procedure: the protective layer 30 is formed, the through-holes 30a and the second bumps 32 are formed in the protective layer 30, and the sealing layer 31 containing the second conductive paste 34 is then formed.

Figure 7:
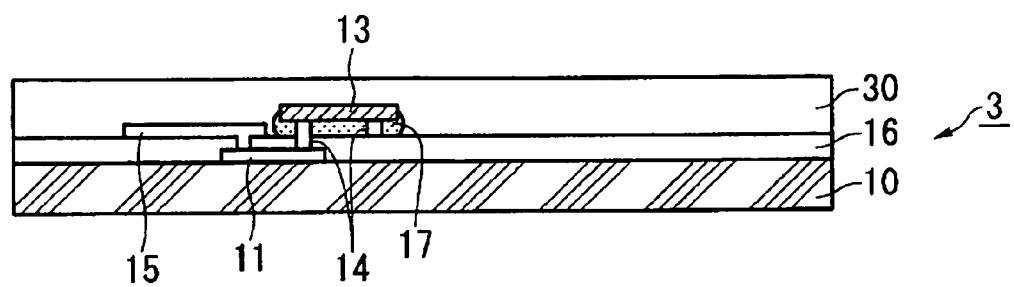
FIG. 7 is a schematic view illustrating one of the steps of manufacturing the organic EL apparatus.

As shown in FIG. 7, the protective layer 30 is formed such that the protective layer 30 entirely covers the TFTs 13 and organic EL connections 15 arranged on the wiring substrate 3.

Preferable examples of a material for forming the protective layer 30 include various resins such as an epoxy resin and an acrylic resin. In this embodiment, a photosensitive acrylic resin is preferably used. When such a photosensitive acrylic resin is used, the through-holes 30a can be readily formed by UV exposure as described below, which is preferable.

The protective layer 30 may be formed by the vapor phase process described above using an inorganic material.

After the protective layer 30 is formed, a flat plate is pressed against the surface of the protective layer 30, whereby the surface of the protective layer 30 is planarized. In this operation, the flat plate is preferably pressed against it with a pressure insufficient to break the TFTs 13. The surface of the protective layer 30 may be planarized using a roller.

A releasing agent is then applied to the protective layer 30 and a mask with a pattern corresponding to the arrangement of the through-holes 30a is joined to the resulting protective layer 30 in a vacuum. The resulting protective layer 30 is heat-treated (baked), whereby the acrylic resin is pre-cured.

Figure 8:
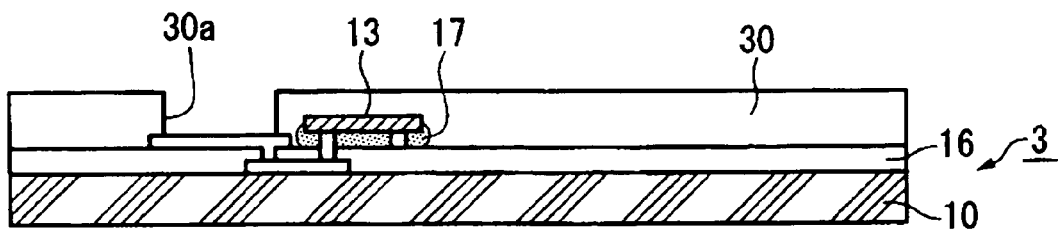
FIG. 8 is a schematic view illustrating one of the steps of manufacturing the organic EL apparatus.

The resulting protective layer 30 having the mask thereon is subjected to UV exposure, the mask is removed therefrom, and the protective layer 30 is then developed, whereby the through-holes 30a are formed in the protective layer 30 as shown in FIG. 8.

Figure 9:
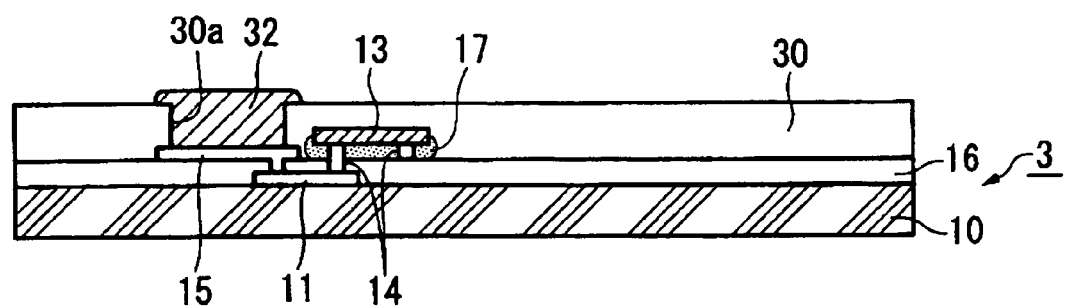
FIG. 9 is a schematic view illustrating one of the steps of manufacturing the organic EL apparatus.

Next, the second bumps 32 are formed as shown in FIG. 9.

In this embodiment, the second bumps 32 are formed by the electroless plating process. The second bumps 32 are formed in the same step as that of forming the TFT connections 14 by the electroless plating process.

The second bumps 32 can be formed by a process for applying silver paste onto walls of the through-holes 30a other than the electroless plating process. In the applying process, since pieces of the silver paste are placed in the through-holes 30a, the second bumps 32 can be formed in such a manner that the pieces of the silver paste are prevented from being deformed in a step of joining the wiring substrate 3 to the organic EL substrate 4 as described below.

A process for providing pieces of solder into the through-holes 30a may be used other than the silver paste-applying process. The wiring substrate 3 can be electrically connected to the organic EL substrate 4 by the solder piece-providing process.

Figure 10:
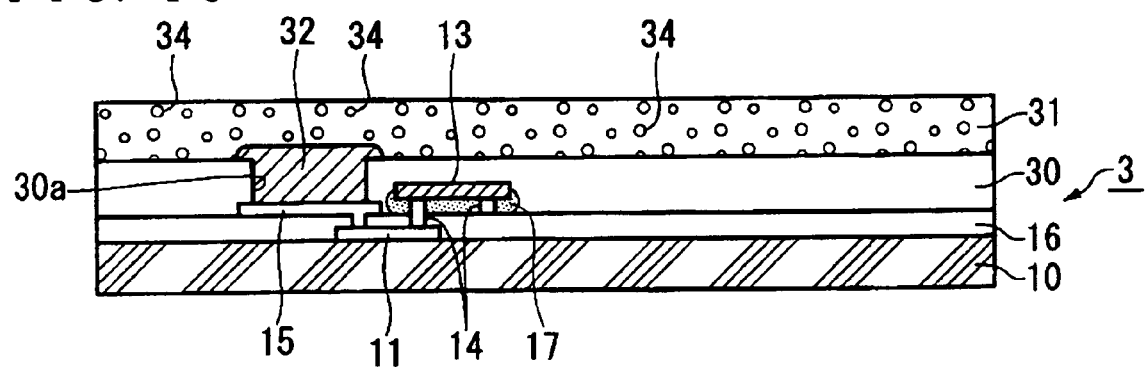
FIG. 10 is a schematic view illustrating one of the steps of manufacturing the organic EL apparatus.

Next, the sealing layer 31 containing the second conductive paste 34 is formed as shown in FIG. 10.

Since the sealing layer 31 contains the second conductive paste 34, the second bumps 32 are electrically connected to the cathodes 25 with the conductive particles contained in the second conductive paste 34 when the wiring substrate 3 is joined to the organic EL substrate 4 in a step described below.

The sealing layer 31 contains a material having high gas barrier properties and an adhesive for securely joining the wiring substrate 3 to the organic EL substrate 4.

An electrically conductive film may be placed in the sealing layer 31 instead of the second conductive paste 34.

Step of Joining Wiring Substrate to Organic EL Substrate

Figure 11:
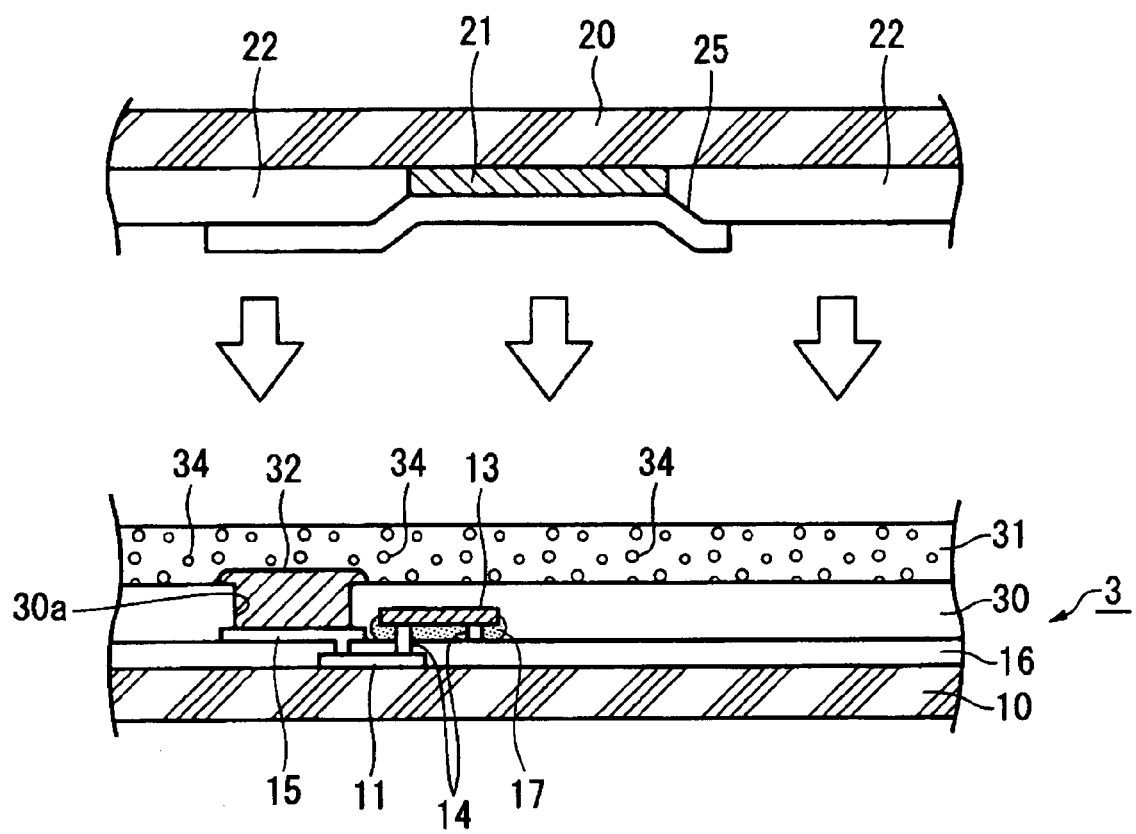
FIG. 11 is a schematic view illustrating one of the steps of manufacturing the organic EL apparatus.
Figure 12:
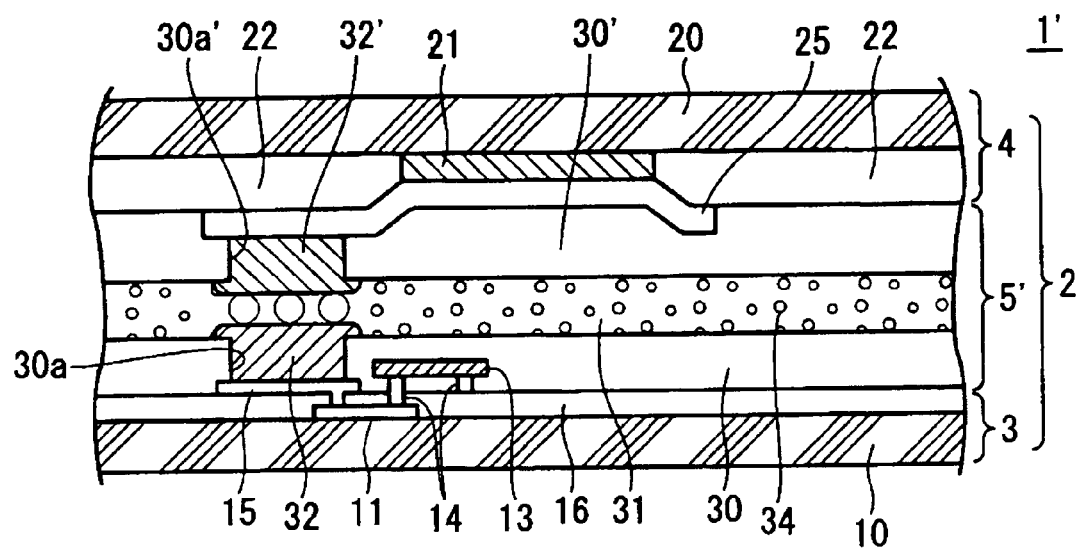
FIG. 12 is a sectional view showing a configuration of an organic EL apparatus according to a second embodiment of the present invention.

With reference to FIG. 11, a step of joining the wiring substrate 3 to the organic EL substrate 4 to complete the organic EL apparatus 1 shown in FIG. 1 is described.

The organic EL substrate 4 has a configuration in which the organic EL devices 21, the insulating layer 22, and the cathodes 25 are arranged on or above the transparent sheet 20 and is upside down as shown in FIG. 11.

The wiring substrate 3 is allowed to face the organic EL substrate 4, joined thereto, and then pressed thereagainst, whereby the cathodes 25 are electrically connected to the second bumps 32 with the conductive particles contained in the second conductive paste 34.

The wiring substrate 3 is securely joined to the organic EL substrate 4 with the adhesive contained in the sealing layer 31.

In this embodiment, since the wiring substrate 3 includes the protective layer 30, the TFTs 13 are prevented from being dislodged and/or broken in the joining step. Therefore, the wiring substrate 3 can be pressed against the organic EL substrate 4 with a strong pressure. Hence, the resulting wiring substrate 3 and organic EL substrate 4 are prevented from being warped.

Since the wiring substrate 3 is securely joined to the organic EL substrate 4 with the sealing layer 31 placed therebetween, moisture and oxygen are prevented from permeating the organic EL devices 21.

After the substrates are joined to each other as shown in FIG. 11, end portions of the resulting substrates are sealed with a sealant or another agent, whereby the organic EL apparatus 1 shown in FIG. 1 is completed.

In the organic EL apparatus 1, the cathodes 25, the organic EL devices 21, the hole injection/transfer layers, and the anodes are arranged in that order when viewed from the wiring substrate 3 to the organic EL substrate 4 and light is emitted through the transparent sheet 20. Therefore, the organic EL apparatus 1 is referred to as a top emission-type organic EL apparatus.

In the method for manufacturing the organic EL apparatus 1, since the wiring substrate 3 includes the protective layer 30 as described above, a strong pressure can be applied to the wiring substrate 3 and the organic EL substrate 4 to join them together. Therefore, the joined wiring substrate 3 and organic EL substrate 4 can be prevented from being warped, the second bumps 32 can be prevented from being deformed, and the gap between the wiring substrate 3 and organic EL substrate 4 can be kept constant.

Since the protective layer 30 protects the TFTs 13 in such a manner that principal portions of the TFTs 13 are not in contact with the sealing layer 31, the TFTs 13 can be prevented from being dislodged and/or broken.

In the Background Art, the following technique is disclosed: light-emitting devices are electrically connected to driving devices with an electrically conductive material and a sealing resin is injected between an electro-optical substrate and a driving circuit substrate from the outside. The problems of this technique can be completely solved by the method of this embodiment.

Since the surface of the protective layer 30 is planarized, the gap between the wiring substrate 3 and organic EL substrate 4 joined to each other can be kept constant. Therefore, the advantages described above can be secured.

The through-holes 30a can be formed in the protective layer 30 in such a manner that the through-holes 30a are arranged at positions corresponding to the organic EL connections 15 and the TFTs 13 are covered with the protective layer 30. Furthermore, the second bumps 32 for electrically connecting the TFTs 13 to the cathodes 25 and organic EL devices 21 can be each formed on the corresponding organic EL connections 15.

Therefore, the TFTs 13 can be electrically connected to the cathodes 25 and organic EL devices 21 without sacrificing the advantages obtained by forming the protective layer 30.

Since the protective layer 30 is subjected to UV exposure using the mask having the pattern corresponding to the arrangement of the through-holes 30a, regions irradiated with UV light and regions not irradiated with UV light can be selectively formed depending on the pattern.

Therefore, a photoreactive resin sensitive to UV light, for example, a photocurable resin or a resin of which portions irradiated with UV light can be removed, can be arbitrarily used to form the protective layer 30.

Since the second bumps 32 placed in the through-holes 30a are formed by a plating process, particularly the electroless plating process, the following advantages can be achieved: the second bumps 32 can be formed at micron-sized areas, tact time can be reduced, and the second bumps 32 are uniform in thickness. Furthermore, a base electrode and a photolithographic process are not necessary. Hence, manufacturing costs and tact time can be reduced.

Since the sealing layer 31 is provided on the protective layer 30 and the wiring substrate 3 and the organic EL substrate 4 are then sealed, the wiring substrate 3 can be securely joined to the organic EL substrate 4 and both substrates can be securely sealed.

Since the sealing layer 31 contains the second conductive paste 34, the above advantages can be secured the second bumps 32 can be securely electrically connected to the TFTs 13 and organic EL devices 21.

Organic EL Apparatus of Second Embodiment

With reference to FIG. 12, an organic EL apparatus according to a second embodiment of the present invention will now be described.

The same components used in this embodiment as those used in the first embodiment have the same reference numerals in order to simplify the description.

In this embodiment, an organic EL substrate 4 is in contact with a second protective layer 30' having second through-holes 30a' and second bumps 32' as shown in FIG. 12.

With reference to FIG. 12, the organic EL apparatus 1' includes a functional layer 5' instead of the functional layer 5 of the first embodiment.

The functional layer 5' includes a first sealing layer 31 for joining the organic EL substrate 4 to a wiring substrate 3 to seal both the substrates, a first protective layer 30 having first through-holes (openings) 30a, and first bumps (electrical connections) 32 each placed in the first through-holes 30a, the first protective layer 30 and the first bumps 32 being disposed on the side close to the wiring substrate 3. The functional layer 5' further includes the second protective layer 30' having the second through-holes (openings) 30a', and the second bumps (electrical connections) 32' each placed in the second through-holes 30a', the second protective layer 30' and the second bumps 32' being disposed on the side close to the organic EL substrate 4. That is, the first protective layer 30 is in contact with a face of the wiring substrate 3 on which first functional devices are arranged and the protective layer 30' is in contact with a face of the organic EL substrate 4 on which second functional devices are arranged.

The first bumps 32 are each electrically connected to the corresponding second bumps 32' with electrically conductive particles contained in the sealing layer 31.

According to the above configuration, TFTs 13 arranged on the wiring substrate 3 are covered with the first protective layer 30 and cathodes 25 and organic EL devices 21 arranged on the organic EL substrate 4 are covered with the second protective layer 30'. Hence, the TFTs 13, the cathodes 25, and the organic EL devices 21 are prevented from being dislodged or broken in a step of joining the wiring substrate 3 to the organic EL substrate 4.

Therefore, in this embodiment, the cathodes 25 and the organic EL devices 21 can be securely protected in addition to the above advantage.

Method for Forming Through-holes According to Another Embodiment

In the first embodiment, the mask is placed on the protective layer 30 containing the photosensitive acrylic resin and light is applied to the resulting protective layer 30 through the mask, whereby the through-holes 30a are formed in the protective layer 30.

The present invention is not limited to such a technique using the mask. A template having a pattern corresponding to the arrangement of the through-holes 30a may be pressed against the protective layer 30, whereby the through-holes 30a are formed in the protective layer 30.

In this embodiment, only manufacturing steps and components different from those described in the above embodiments are described and descriptions of the same manufacturing steps and components as those described in the above embodiments are omitted.

This embodiment is described with reference to FIG. 13 using a wiring substrate 3 shown in FIG. 7.

With reference to FIG. 7, the wiring substrate 3 includes a protective layer 30 containing an acrylic resin or an epoxy resin. The protective layer 30 need not contain a photosensitive material but preferably contains a resin material that can be plastically deformed with ease by a template-pressing process described below and has relatively low viscosity.

Figure 13:
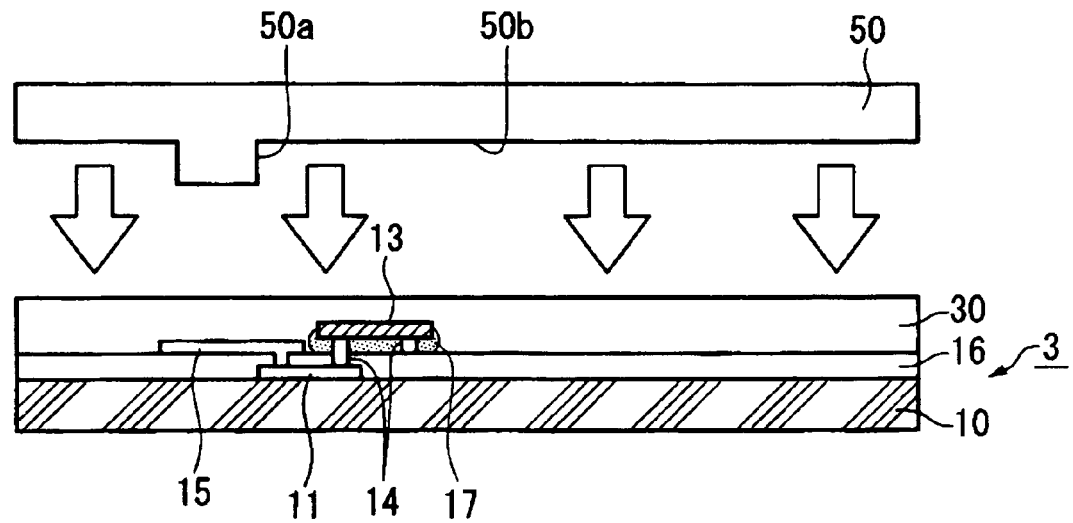
FIG. 13 is an enlarged view illustrating a method for forming through-holes according to another embodiment of the present invention.

With reference to FIG. 13, a template 50 is pressed against the upper face of the protective layer 30.

The template 50 is herein defined as a plate having a predetermined pattern to be transferred to the protective layer 30. In particular, the template 50 includes protrusions 50a for forming through-holes 30a.

According to the above configuration, the protrusions 50a corresponding to the through-holes 30a are allowed to perforate the protective layer 30 by pressing the template 50 against the protective layer 30, and a pattern corresponding to the arrangement of the protrusions 50a can be transferred to the protective layer 30 by removing the template 50 from the protective layer 30, whereby the through-holes 30a are formed in the protective layer 30.

The method of this embodiment is simpler than the method for forming the through-holes 30a, shown in FIG. 8, according to the first embodiment.

The protrusions 50a may be tapered such that the template 50 can be readily removed from the protective layer 30.

The template 50 may be pressed against the protective layer 30 in such a manner that the template 50 is fixed to a belt connected to a rotatable roller, the belt is moved by rotating the roller, the template 50 is thereby circularly moved, and the wiring substrate 3 is moved with a conveyer. In this procedure, since the template 50 can be pressed against the protective layer 30 while the template 50 is being continuously moved, the wiring substrate 3 can be manufactured at a large scale volume.

Alternatively, the template 50 may have a recessed section 50b with a flat face for planarizing the surface of the protective layer 30. Even if the surface of the protective layer 30 is not flat, the through-holes 30a can be formed in the protective layer 30 and the surface of the protective layer 30 can be planarized by pressing the template 50 having the protrusions 50a and the recessed section 50b against the protective layer 30. Therefore, the formation of the through-holes 30a can be achieved together with the planarization of the protective layer 30. Hence, a step of planarizing the surface of the protective layer 30 can be omitted. Thus, the number manufacturing steps can be reduced, whereby manufacturing costs are reduced.

Another Method for Joining Wiring Substrate to Organic EL Substrate

In the embodiments described above, an organic EL apparatus 1 is manufactured by a technique for forming second bumps 32 in through-holes 30a. In this embodiment, a technique for providing electrically conductive particles into the through-holes 30a is used.

In this embodiment, only manufacturing steps and components different from those described in the above embodiments are described and descriptions of the same manufacturing steps and components as those described in the above embodiments are omitted.

Figure 14:
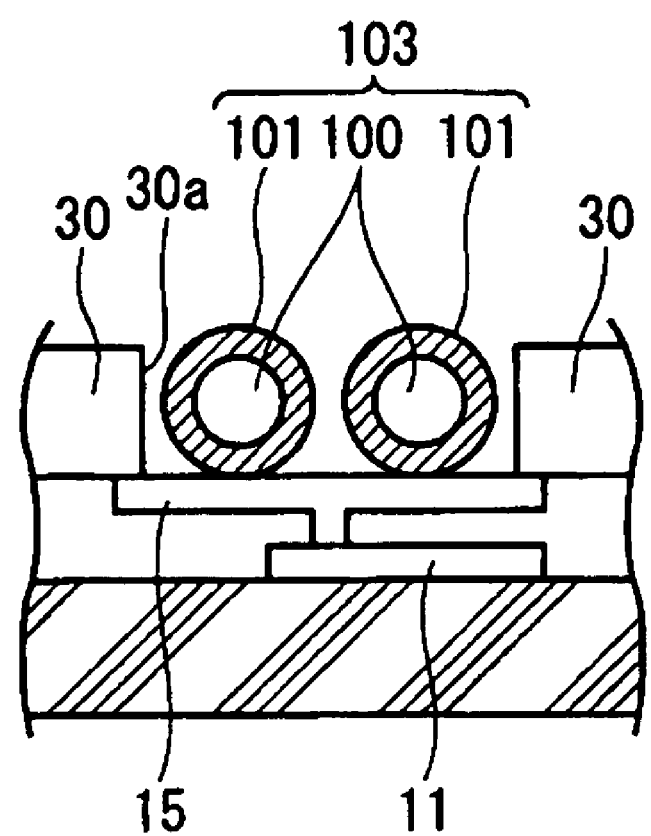
FIG. 14 is an enlarged view showing a through-hole.

FIG. 14 is an enlarged view showing one of the through-holes 30a. A plurality of electrically conductive particles (electrical connections) 103 are placed in each through-hole 30a. The electrically conductive particles 103 each include corresponding resin spheres 100 containing polystyrene and corresponding electrically conductive coatings 101 formed by depositing an electrically conductive material such as gold on the resin spheres. The electrically conductive particles 103 have a diameter greater than the thickness of the protective layer 30.

When the wiring substrate 3 is joined to the organic EL substrate 4 and then securely pressed thereagainst as described in the above embodiments, the polystyrene resin spheres 100 are thereby crushed and organic EL connections 15 are each electrically connected to corresponding cathodes 25 with the electrically conductive coatings 101.

The same advantage as that described in the above embodiments can be achieved by placing the electrically conductive particles 103 in the through-holes 30a.

Furthermore, the organic EL apparatus 1 can be manufactured without using a complicated process such as electroless plating.

What is claimed is:

1. A method for manufacturing a substrate conjugate, comprising:
a step of joining a first substrate including a first functional device to a second substrate including a second functional device;
a step of providing a protective layer on at least one of:
a face of the first substrate on which the first functional device is placed; and
a face of the second substrate on which the second functional device is placed;
a step of forming an opening through the protective layer such that the opening is located at a position corresponding to a terminal section electrically connected to the one of the first and the second functional devices covered by the protective layer;
a step of forming a bump in and on the opening to form an electrical connection on the terminal section;
a step of providing a sealing layer on the protective layer, the sealing layer electrically connecting the first functional device to the second functional device and sealing the first substrate to the second substrate, wherein the protective layer prevents the one of the first functional device and the second functional device on which the protective layer is provided from contacting the sealing layer, the sealing layer including resin spheres each coated with a conductive layer thereon;
a step of applying a pressure on the first substrate and the second substrate to simultaneously seal the first substrate and the second substrate and electrically connect the first functional device and the second functional device; and
a step of crushing the resin spheres to electrically connect the first functional device and the second functional device when the first substrate and the second substrate are joined and sealed,
wherein the bump extends out of the opening and into the sealing layer to electrically connect the first functional device to the second functional device, and the bump is connected to the terminal section of the one of the first and the second functional devices and located at a lateral distance from principal portions of the one of the first and the second functional devices along a longitudinal direction of the protective layer,
wherein the first and the second functional devices form a display pixel and one of the first and the second functional devices comprises a thin film transistor formed through transfer.

2. The method according to claim 1 further comprising: a step of planarizing a surface of the protective layer.

3. The method according to claim 1, wherein the opening is formed in the protective layer such that light is applied to the protective layer through a mask having a pattern corresponding to the opening.

4. The method according to claim 1, wherein the opening is formed in the protective layer through a process in which a template having a pattern corresponding to the opening is pressed against the protective layer.

5. The method according to claim 1, wherein the electrical connection is formed in the opening by a plating process.

6. The method according to claim 1, wherein the electrical connection is formed by providing a piece of silver paste in the opening.

7. The method according to claim 1, wherein the electrical connection is formed by providing an electrical conductive particle in the opening.

8. The method according to claim 1, wherein the electrical connection is formed by providing a piece of solder in the opening.

9. The method according to claim 1, wherein the step of providing a sealing layer on the protective layer includes providing the sealing layer to cover the electrical connection.

10. The method according to claim 9, wherein the sealing layer contains at least one of anisotropic conductive paste and an anisotropic conductive film.

11. The method according to claim 1, wherein the fill a gap defined between the first substrate and the second substrate.

12. The method according to claim 1, wherein the protective layer prevents the principal portions of said at least one of the first functional device and the second functional device from contacting the sealing resin.

13. The method according to claim 1, wherein said one of the first functional device and the second functional device has a lower surface; the upper surface of said one of the first functional device and the second functional device is insulated from the sealing layer by the protective layer; and said one of the first functional device and the second functional device is connected to the bump through the lower surface.

14. The method according to claim 1, wherein the bump has a width larger than a width of said one of the first functional device and the second functional device.

15. A method for manufacturing an electro-optical apparatus, comprising;
a step of joining an electro-optical substrate including a plurality of light-emitting devices to a driving circuit substrate including a plurality of driving devices located respectively at positions corresponding to the light-emitting devices;

a step of providing a protective layer on at least one of:
  a face of the electro-optical substrate on which the light-emitting devices are arranged; and
  a face of the driving circuit substrate on which the driving devices are arranged;
a step of forming a plurality of openings through the protective layer such that the openings are located respectively at positions corresponding to a plurality of terminal sections electrically connected to the one of the light-emitting devices and the driving devices covered by the protective lever;
a step of forming a plurality of bumps in and on the openings to form electrical connections on the terminal sections;
a step of providing a sealing layer on the protective layer, the sealing layer electrically connecting the plurality of driving devices to the light emitting devices and sealing the electro-optical substrate and the driving circuit substrate, wherein the protective layer prevents at least one of the light-emitting devices and the driving devices on which the protective layer is provided from contacting the sealing layer, the sealing layer including resin spheres each coated with a conductive layer thereon;
a step of applying a pressure on the electro-optical substrate and the driving circuit substrate to simultaneously seal the electro-optical substrate and the driving circuit substrate and to electrically connect the light-emitting devices and the driving devices; and
a step of crushing the resin spheres to electrically connect the light-emitting devices and the driving devices when the electro-optical substrate and the driving circuit substrate are joined and sealed,
wherein the bumps extend out of the opening and into the sealing layer to electrically connect the light-emitting devices to the driving devices, the bumps are connected to the terminal sections, and each of the bumps is located at a lateral distance from principal portions of a corresponding one of the light-emitting devices and the driving devices along a longitudinal direction of the protective layer,
wherein each of the light-emitting devices forms a display pixel with a corresponding one of the driving devices and each of the driving devices comprises a thin film transistor formed through transfer.

* * * * *